(12) United States Patent
Wu

(10) Patent No.: US 10,804,349 B2
(45) Date of Patent: Oct. 13, 2020

(54) DISPLAY PANEL AND DISPLAY DEVICE

(71) Applicant: Wuhan China Star Optoelectronics Semiconductor Display Technology Co., Ltd., Wuhan (CN)

(72) Inventor: Kerong Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/468,683

(22) PCT Filed: Mar. 5, 2019

(86) PCT No.: PCT/CN2019/076951
§ 371 (c)(1),
(2) Date: Jun. 12, 2019

(87) PCT Pub. No.: WO2020/155287
PCT Pub. Date: Aug. 6, 2020

(65) Prior Publication Data
US 2020/0243628 A1    Jul. 30, 2020

(30) Foreign Application Priority Data
Jan. 30, 2019   (CN) .......................... 2019 1 0089068

(51) Int. Cl.
*H01L 27/32*       (2006.01)
*H01L 51/00*       (2006.01)

(52) U.S. Cl.
CPC ...... *H01L 27/3258* (2013.01); *H01L 27/3211* (2013.01); *H01L 51/0097* (2013.01); *H01L 2251/5338* (2013.01)

(58) Field of Classification Search
CPC .............. H01L 27/124; H01L 27/3258; G02F 1/136209; G02F 2001/136218
See application file for complete search history.

(56) References Cited

U.S. PATENT DOCUMENTS

| 2015/0060778 | A1* | 3/2015 | Kim ..................... H01L 27/3258 257/40 |
| 2017/0194409 | A1* | 7/2017 | Jeong .................. H01L 27/3248 |
| 2018/0366496 | A1* | 12/2018 | Li ........................ H01L 27/3262 |
| 2019/0131368 | A1* | 5/2019 | Zhang ................. H01L 27/3258 |

* cited by examiner

*Primary Examiner* — Kyoung Lee
*Assistant Examiner* — Christina A Sylvia (57) ABSTRACT

A display panel includes a bending area and a non-bending area connected to the bending area. The display panel includes an array substrate. The array substrate includes a plurality of first pixel regions arranged in a plurality of rows parallel to each other and disposed in the bending area, and a plurality of second pixel regions arranged in a plurality of rows parallel to each other and disposed in the non-bending area; a plurality of flexible connection regions is formed for connecting adjacent ones of the first pixel regions, and for connecting the first pixel regions and the second pixel regions, wherein each flexible connection region has a slot, and the slot is filled with an organic photoresist layer.

10 Claims, 6 Drawing Sheets

DISPLAY PANEL AND DISPLAY DEVICE

RELATED APPLICATIONS

This application is a National Phase of PCT Patent Application No. PCT/CN2019/076951 having International filing date of Mar. 5, 2019, which claims the benefit of priority of Chinese Patent Application No. 201910089068.4 filed on Jan. 30, 2019. The contents of the above applications are all incorporated by reference as if fully set forth herein in their entirety.

FIELD AND BACKGROUND OF THE INVENTION

The present invention relates to the field of liquid crystal display, and especially to display panel and display device.

With the development of display technology, which now focuses on OLED (organic light-emitting diode) display technology, the development and application of a new generation of display technology is in full swing, and is gradually being applied to many fields, such as smart bracelets, smart watches, VR (Virtual Reality) devices, mobile phones, e-books and electronic newspapers, televisions, and personal laptops, etc. The future of the display lies in OLED, while the future of OLED lies in flexible display. The development of "flexible display" technology at this stage is only a beginning; what we see now is just the tip of the iceberg. Today, with the rapid development of emerging electronic products and the Internet, flexible display technology is obviously the future direction of electronic products.

Compared with the traditional TFT-LCD (thin film transistor liquid crystal display) technology, OLED technology's greatest strength is that it can be made into a collapsible/bendable product. When the flexible OLED screen is impacted by external force, or after multiple bending, curling or laser lift-off (LLO), the inside of the screen is easily affected by stress and strain. Especially for the array substrate, the metal trace, the inorganic layer and OLED materials are prone to cracking, resulting in failure of the screen display. Therefore, improving the bending duration of the bending area becomes the key to whether the folding product can be realized.

SUMMARY OF THE INVENTION

In order to solve the above technical problem, the present invention provides a display panel and a display device, wherein each flexible connection region of the bending area thereof has a slot, so that there is a slot in an inorganic layer and between adjacent two rows of the pixel regions in the bending area; the two rows of the pixel regions are separated, and the slot is filled with an organic photoresist layer, which effectively alleviates the stress of the corresponding inorganic layer or metal trace in the display panel, especially, the array substrate, and improves the bending effect to release the stress of the adjacent inorganic layer.

A technical solution to solve the above problem is that the present invention provides a display panel including a bending area and a non-bending area connected to the bending area, the display panel including an array substrate, the array substrate including a plurality of first pixel regions arranged in a plurality of rows parallel to each other and disposed in the bending area, a plurality of second pixel regions arranged in a plurality of rows parallel to each other and disposed in the non-bending area, and a plurality of flexible connection regions for connecting adjacent ones of the first pixel regions, and for connecting the first pixel regions and the second pixel regions, wherein each flexible connection region has a slot, and the slot is filled with an organic photoresist layer.

In an embodiment of the invention, one of the flexible connection regions is disposed between each adjacent two rows of the first pixel regions, each first pixel region has a plurality of first main pixels, each flexible connection region has a connection segment corresponding to one of the first main pixels, the second pixel regions are connected to the first pixel regions through one of the flexible connection regions, each second pixel region has a plurality of second main pixels, and an area of each second main pixel is equal to a sum of areas of each first main pixel and its corresponding connection segment.

In an embodiment of the invention, each first main pixel has at least one first sub-pixel, each second main pixel has at least one second sub-pixel, the at least one first sub-pixel has a first light-emitting region, the at least one second sub-pixel has a second light-emitting region, and an area of the at least one first light-emitting region equal to an area of the at least one second light-emitting region.

In an embodiment of the invention, at least one first sub-pixel is one of red sub-pixel, green sub-pixel and blue sub-pixel, and the at least one second sub-pixel is one of red sub-pixel, green sub-pixel or blue sub-pixel.

In an embodiment of the invention, each of the first main pixels includes one red sub-pixel, one green sub-pixel and one blue sub-pixel arranged in sequence, and each of the second main pixels includes one red sub-pixel, one green sub-pixel, and one blue sub-pixel arranged in sequence.

In an embodiment of the invention, each of the first main pixels includes one red sub-pixel and one green sub-pixel, or one blue sub-pixel and one green sub-pixel, or one red sub-pixel and one blue a sub-pixel, and each of the second main pixels includes one red sub-pixel and one green sub-pixel, or one blue sub-pixel and one green sub-pixel, or one red sub-pixel and one blue sub-pixel.

In an embodiment of the invention, in each of the first pixel regions, the first main pixels each having one red sub-pixel and one green sub-pixel are alternately arranged with the first main pixels each having one blue sub-pixel and one green sub-pixel, and in each of the second pixel regions, the second main pixels each having one red sub-pixel and one green sub-pixel is alternately arranged with the second main pixels each having one blue sub-pixel and one green sub-pixel.

In an embodiment of the invention, in all of the first pixel regions, the arranged positions of the green sub-pixels correspond to each other, and in all of the second pixel regions, the arranged positions of the green sub-pixels correspond to each other.

In an embodiment of the invention, the array substrate includes a flexible substrate, a barrier layer overlying the flexible substrate, a buffer layer overlying the barrier layer, a first gate insulating layer overlying the buffer layer, a second gate insulating layer overlying the first gate insulating layer, a dielectric layer overlying the second gate insulating layer, a metal trace disposed on the dielectric layer, a flat layer disposed on the dielectric layer and the metal trace, and wherein in the bending area, the slot extends from the dielectric layer to the flexible substrate, in the position of the slot, the metal trace is disposed on the organic photoresist layer.

A technical solution to solve the above problem is that the present invention provides a display device, including the display panel.

The display panel and the display device in the present invention, wherein each flexible connection region of the bending area has a slot, so that there is an inorganic layer slot between adjacent two rows of the pixel regions in the bending area, the two rows of the pixel regions are separated, and the slot is filled with an organic photoresist layer, which effectively alleviates the stress of the corresponding each inorganic layer or metal trace in the display panel especially the array substrate, and improves the bending effect to release the stress of the adjacent inorganic layer. At the same time, the light-emitting areas of the corresponding sub-pixels of the bending area and the non-bending area are set to be consistent, and the resolutions of the bending area and the non-bending area are effectively maintained, so that there is no difference in visual perception.

BRIEF DESCRIPTION OF THE SEVERAL VIEWS OF THE DRAWINGS

The accompanying figures to be used in the description of embodiments of the present invention will be described in brief to more clearly illustrate the technical solutions of the embodiments. Obviously, the accompanying figures described below are only part of the embodiments of the present invention, from which figures those skilled in the art can derive further figures without making any inventive efforts.

REFERENCE NUMBERS

| | |
|---|---|
| 1 display device | 100 display panel |
| 10 array substrate | |
| 20 bending area | 30 non-bending area |
| 21 first pixel region | 22, 22a flexible connection region |
| 211a, 211b first main pixel | 221a, 211b connection segment |
| 2111a, 2111b first sub-pixel | |
| 31 second pixel region | 311a, 311b second main pixel |
| 3111a, 3111b second sub-pixel | |
| 11 flexible substrate | 12 barrier layer |
| 13 buffer layer | |
| 14 first gate insulating layer | 15 second gate insulating layer |
| 16 dielectric layer | 17 flat layer |
| 18 metal trace | 19 pixel defining layer |
| 110 anode | 1011 active layer |
| 10111 source area | 10112 drain area |
| 1012 first gate layer | 1013 second gate layer |
| 181 source | 182 drain |
| 2 slot | 3 organic photoresist layer |

DETAILED DESCRIPTION OF PREFERRED SPECIFIC EMBODIMENTS OF THE INVENTION

The embodiments of the present invention are described in detail below, and the examples of the embodiments are illustrated in the drawings, wherein the same or similar reference marks indicate the same or similar elements or elements having the same or similar functions. The embodiments described below with reference to the drawings are intended to be illustrative of the invention and are not to be construed as limiting.

The following description of the various embodiments is provided to illustrate the specific embodiments. Directional terms described by the present invention, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure.

Figure 1:
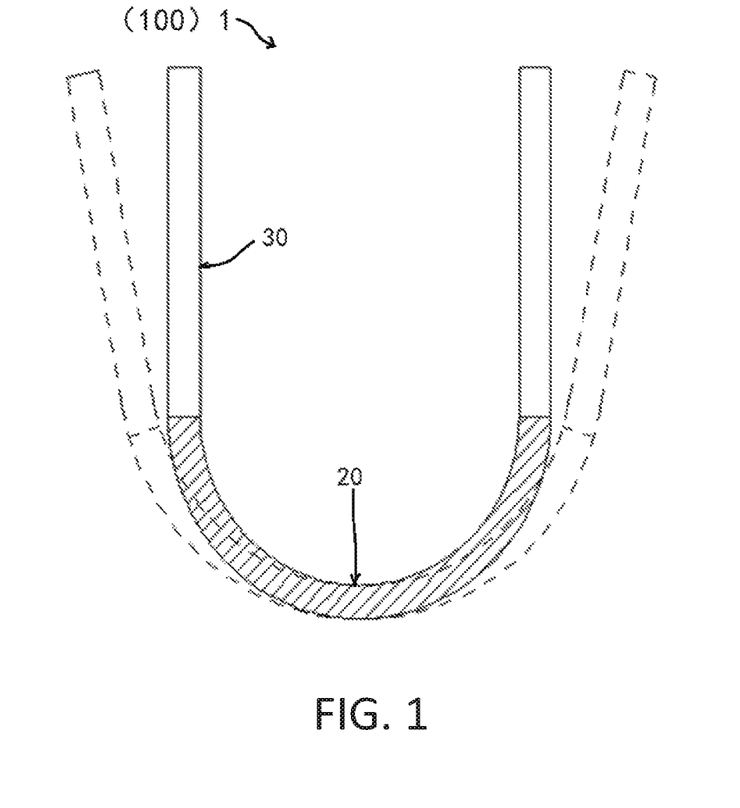
FIG. 1 is a bending state figure of the display panel of the present invention, wherein showing two different degrees of bending.

Referring to FIG. 1, in an embodiment, the display panel 100 of the present invention has a bending area 20 and at least one non-bending area 30 connected to the bending area 20. The non-bending area 30 can be set as one or two; in this embodiment, the non-bending area 30 is provided with two, which are respectively connected to both sides of the bending area 20.

Figure 3:
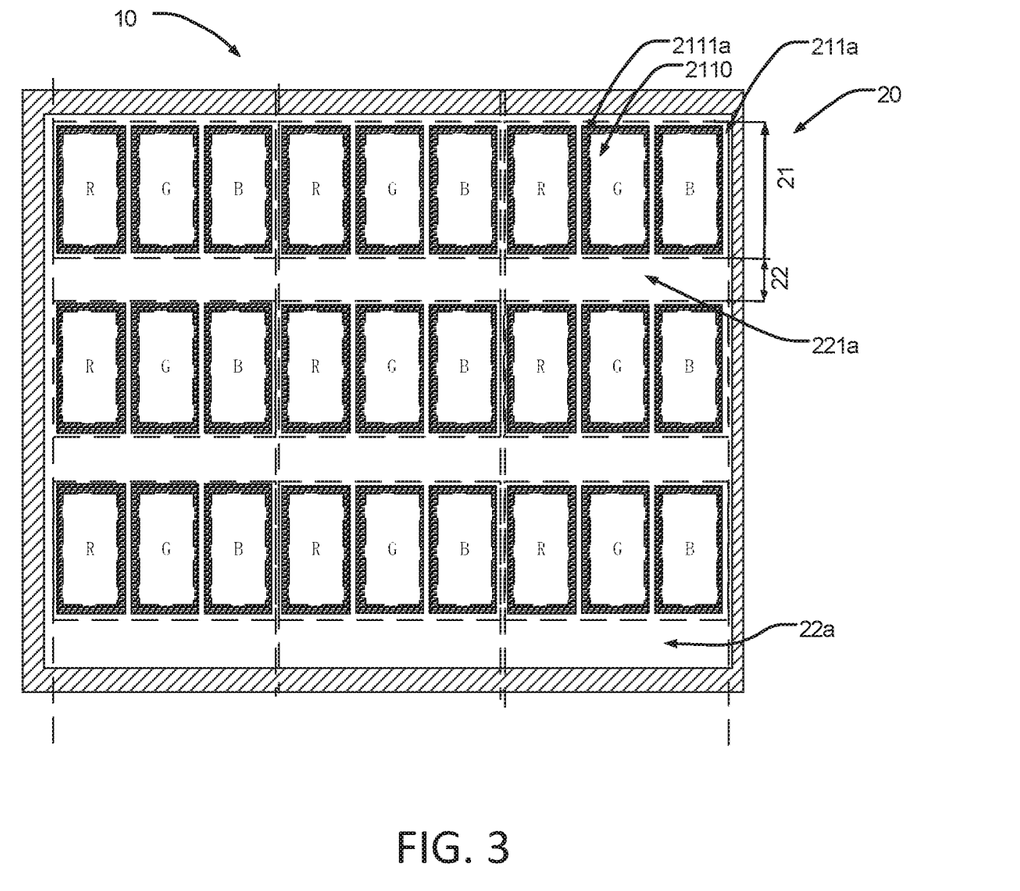
FIG. 3 is a diagram showing a pixel distribution structure of a bending area in an embodiment of the present invention.
Figure 4:
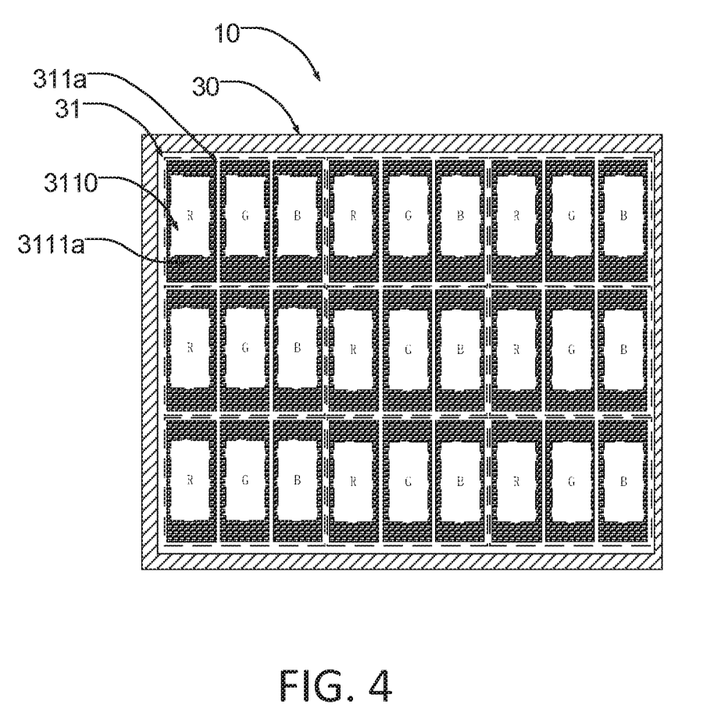
FIG. 4 is a diagram showing a pixel distribution structure of a non-bending area in an embodiment of the present invention.

Referring to FIG. 3 and FIG. 4, the display panel 100 of the present invention includes an array substrate 10. The array substrate 10 includes a plurality of first pixel regions 21, a plurality of flexible connection regions 22 and a plurality of second pixel regions 31.

Referring to FIG. 3, the first pixel regions 21 and the flexible connection regions 22 are disposed in the bending area 20. The first pixel regions 21 are arranged in a plurality of rows parallel to each other. The flexible connection regions 22 are configured to connect the first pixel regions 21. Specifically, one of the flexible connection regions 22 is disposed between each adjacent two rows of the first pixel regions 21.

Referring to FIG. 4, the second pixel regions 31 are arranged in a plurality of rows parallel to each other, and disposed in the non-bending area 30. The flexible connection region 22 is further configured to connect the first pixel regions 21 and the second pixel regions 31. More precisely, the second pixel region 31 located in the non-bending area 30 and the first pixel region 21 located in the bending region 20 are also connected with each other through the flexible connection region 22, in particular, connected with other through the flexible connection regions 22a of the lowermost row in FIG. 3. Briefly, the second pixel region 31 is connected to the first pixel region 21 through one of the flexible connection regions 22, or the non-bending area 30 and the bending area 20 are flexibly connected through one of the flexible connection regions 22.

In this embodiment, each flexible connection region 22 has a slot 2, and the slot 2 is filled with an organic photoresist layer 3.

Figure 2:
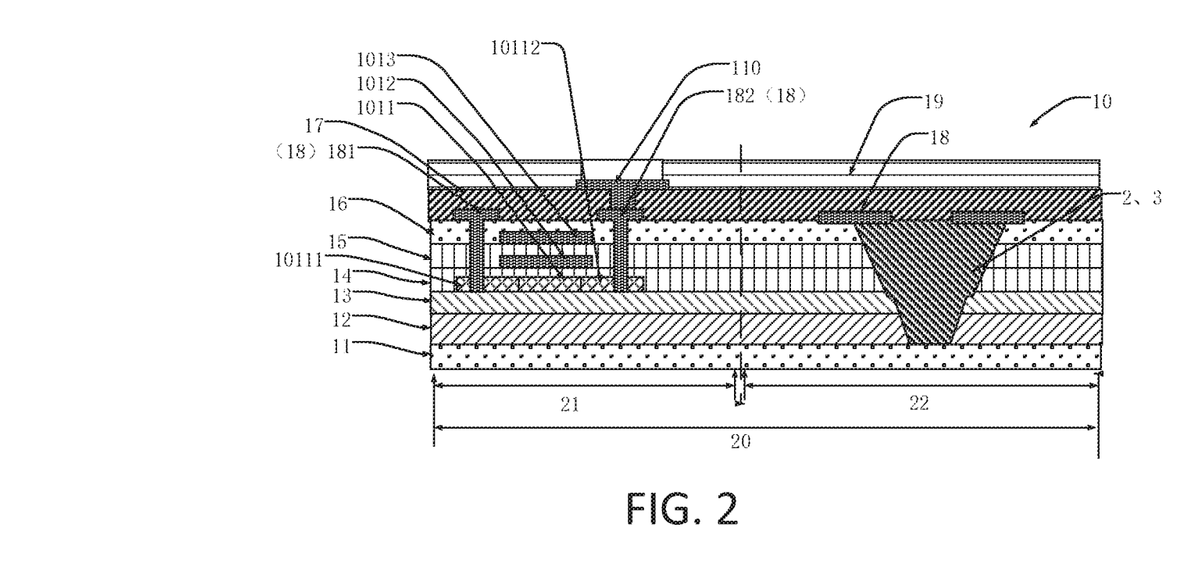
FIG. 2 is a schematic structural diagram of an array substrate in an embodiment of the present invention, wherein a bending area of the array substrate structure is particularly shown.

Specifically, as shown in FIG. 2, the array substrate 10 includes a flexible substrate 11, a barrier layer 12, a buffer layer 13, a first gate insulating layer 14, a second gate insulating layer 15, a dielectric layer 16, a flat layer 17, a metal trace 18, etc. The material used for the flexible substrate 11 is a Polyimide material; The barrier layer 12 overlays the flexible substrate 11; the buffer layer 13 overlies the barrier layer 12; The first gate insulating layer 14 overlies the buffer layer 13; The second gate insulating layer 15 overlies the first gate insulating layer 14; The dielectric layer 16 overlays the second gate insulating layer 15; The metal trace 18 are disposed on the dielectric layer 16; the metal trace 18 are distributed in the bending area 20 and non-bending area 30. The flat layer 17 is disposed on the dielectric layer 16 and the metal trace 18, wherein in the bending area 20, the slot 2 extends from the dielectric layer 16 downward to the flexible substrate 11; That is the slot 2 extends through the dielectric layer 16, the second gate insulating layer 15, the first gate insulating layer 14, the buffer layer 13, and the barrier layer 12, and is stopped in the flexible substrate 11. In the position of the slot 2, the metal trace 18 is disposed on the organic photoresist layer 3.

Of course, in this embodiment, the array substrate 10 may further include other structural layers. As shown in FIG. 2, the array substrate 10 further includes an active layer 1011, a first gate layer 1012, a second gate layer 1013, an anode 110, and a pixel defining layer 19, etc. The active layer 1011 has a source area 10111 and a drain area 10112. The active layer 1011 is disposed on the buffer layer 13; the first gate insulating layer 14 overlies the active layer 1011. The first gate layer 1012 overlies the first gate insulating layer 14; the second gate insulating layer 15 overlies the first gate layer 1012. The second gate layer 1013 is disposed on the second gate insulating layer 15. The dielectric layer 16 overlies the second gate layer 1013, the metal trace 18 is disposed in the same layer as the source 181 and the drain 182, and the source area 10111 is correspondingly connected to the source 181. The drain area 10112 is correspondingly connected to the drain 182, and the anode 110 is disposed on the flat layer 17 and connected to the drain 182.

The main design point of the present invention is that: the slot 2 is disposed in the bending area 20 to improve each inorganic film layer (such as the flexible substrate 11, the barrier layer 12, the buffer layer 13, the first gate insulating layer 14, the second gate insulating layer 15, and the metal trace 18) layered stress distribution to improve the bending resistance of the display panel. Therefore, the other structural layers will not be described one by one.

In order to maintain the resolution of the bending area 20 and the non-bending area 30 consistent to make the visual perception indistinguishable. In this embodiment, as shown in FIG. 3, each first pixel region 21 has a plurality of first main pixels 211a. Each flexible connection region 22 has a connection segment 221a corresponding to one of the first main pixels 211a. Each second pixel region 31 has a plurality of second main pixel 311a. An area of each second main pixel 311a is equal to a sum of the areas of each first main pixel 211a and its corresponding connection segment 221a.

Further, the area of the main pixel area does not represent the light-emitting area, and represents only the design area of each pixel in the array substrate 10. Therefore, in order to maintain the resolution of the bending area 20 and the non-bending area 30 consistent to make the visual perception indistinguishable. It is necessary to keep the light-emitting areas of the bending area 20 and the non-bending area 30 consistent. In this embodiment, each first main pixel 211a has at least one first sub-pixel 2111a, each second main pixel 311a has at least one second sub-pixel 3111a, the first sub-pixel 2111a has a first light-emitting region, the second sub-pixel 3111a has a second light-emitting region, and an area of the first light-emitting region equal to an area of the second light-emitting region.

The first sub-pixel 2111a is one of red sub-pixel, green sub-pixel, and blue sub-pixel. In this embodiment, in one first main pixel 211a, there are one red sub-pixel, one green sub-pixel, and one blue sub-pixel arranged in order from left to right or right to left. The red sub-pixels in all the first pixel regions 21 correspond to each other, the green sub-pixels correspond to each other, and the blue sub-pixels correspond to each other.

The second sub-pixel 3111a is one of red sub-pixel, green sub-pixel, blue sub-pixel. In this embodiment, in one second main pixel 311a, there are a one red sub-pixel, one green sub-pixel and blue sub-pixel.

Figure 5:
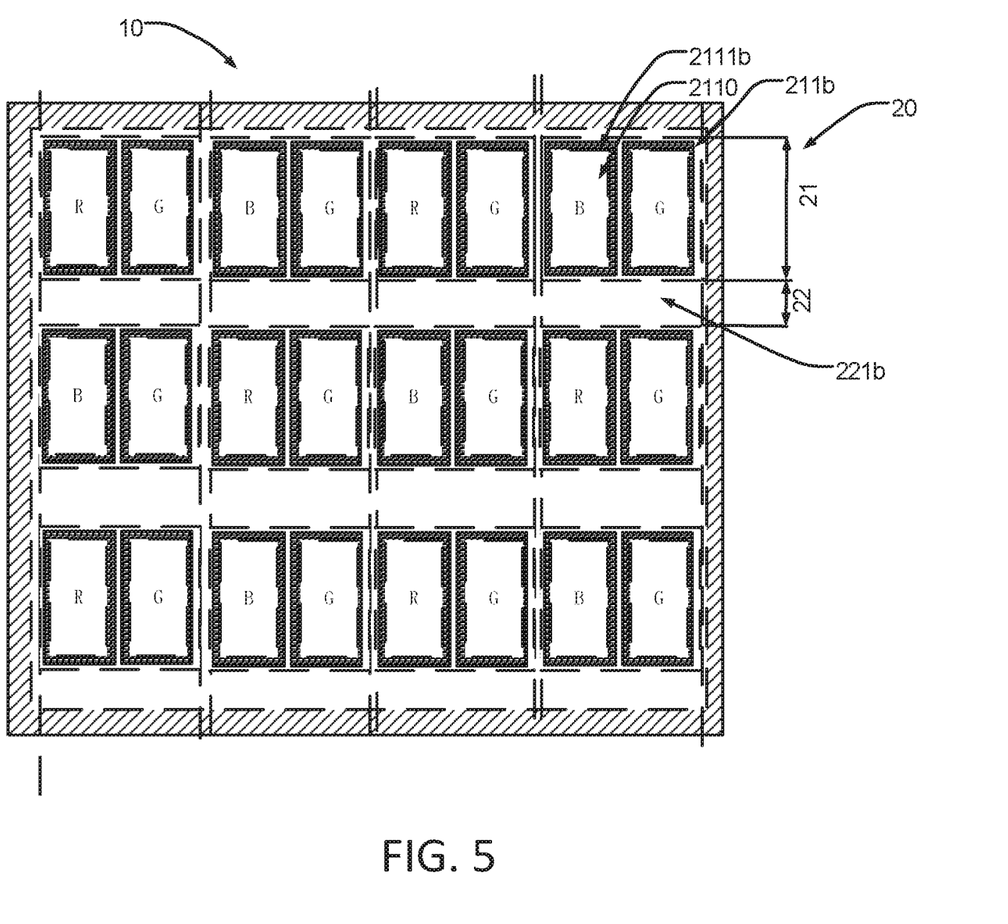
FIG. 5 is a diagram showing a pixel distribution structure of a bending area in another embodiment of the present invention.
Figure 6:
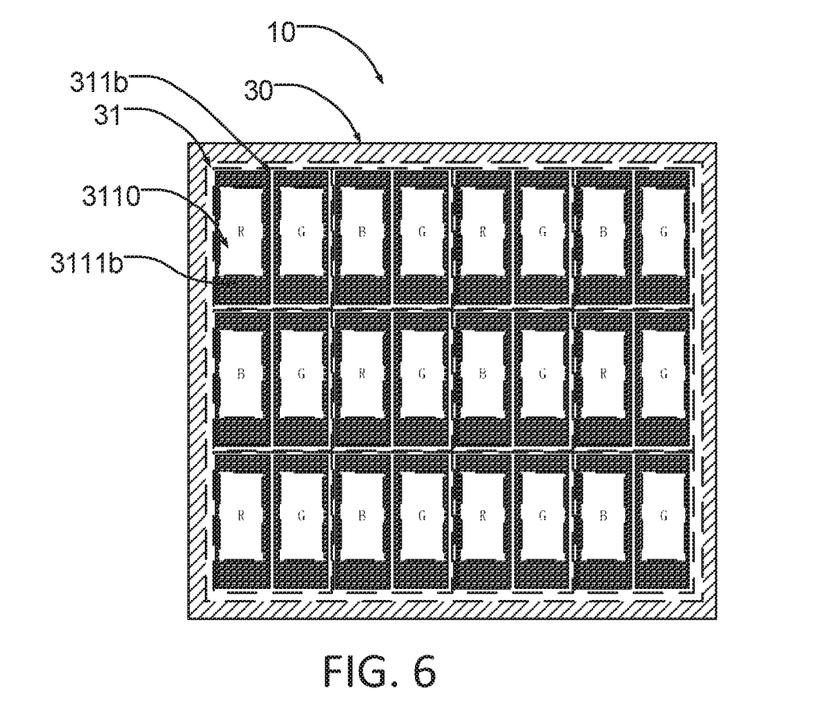
FIG. 6 is a diagram showing a pixel distribution structure of a non-bending area of the present invention.

Or, as shown in FIG. 6 and referring to FIG. 4 in another embodiment of the present invention, the difference from the foregoing embodiment is that the arrangement structure of the first sub-pixel 2111b is different from the foregoing embodiment, as shown in FIG. 5, and refer to FIG. 3. And the arrangement structure of the second sub-pixel 3111b is different from the foregoing embodiment, as shown in FIG. 6, and refer to FIG. 4.

As shown in FIG. 5, and referring to FIG. 3, the sub-pixels of the first sub-pixel 2111b and the second sub-pixel 311b in the embodiment are arranged in a sub pixel rendering (SPR) structure, specifically R (red sub-pixel) G (green sub-pixels) B (blue sub-pixels) G (green sub-pixels) are arranged in a loop. That is, each of the first main pixels 211b includes two first sub-pixels 2111b, one of which is a red sub-pixel and the other is a green sub-pixel, or one blue sub-pixel and one green sub-pixel, or one red sub-pixel and one blue sub-pixel. In each of the first pixel regions 21, the first main pixel 211b having one red sub-pixel and one green sub-pixel are alternately arranged with the first main pixel 211b having one blue sub-pixel and one green sub-pixel. In all of the first pixel regions 21, the arranged positions of the green sub-pixels correspond to each other.

As shown in FIG. 6, and referring to FIG. 4. The second main pixel 311b includes two second sub-pixels 311b. Each second main pixel 311b has one red sub-pixel and one green sub-pixel, or one blue sub-pixel and one green sub-pixel, or one red sub-pixel and one blue sub-pixel. In the second pixel region 31, the second main pixel 311b has one red sub-pixel and one green sub-pixel which is alternately arranged with the second main pixels 311b having one blue sub-pixel and one green sub-pixel. In all of second pixel regions 31, the arranged positions of the green sub-pixels correspond to each other.

The present invention further provides a display device 1 includes the display panel 100. In the embodiment, the display device 1 can be a mobile phone, a computer, a wearable device (watch), etc. The main design of the display device 1 focuses on the bending area 20 of the display panel 100 and the pixel arrangement.

The foregoing is only preferred embodiments of the present invention but are not intended to limit the present invention, any modifications within the spirit and principle of the present invention, equivalent substitutions and improvements should be included in the present within the scope of the invention.

What is claimed is:

1. A display panel, comprising a bending area and a non-bending area connected to the bending area, wherein the display panel comprising an array substrate;

the array substrate comprising:
- a plurality of first pixel regions arranged in a plurality of rows parallel to each other and disposed in the bending area;
- a plurality of second pixel regions arranged in a plurality of rows parallel to each other and disposed in the non-bending area; and
- a plurality of flexible connection regions for connecting adjacent ones of the first pixel regions, and for connecting the first pixel regions and the second pixel regions, wherein each flexible connection region has a slot, and the slot is filled with an organic photoresist layer.

2. The display panel as claimed in claim 1, wherein one of the flexible connection regions is disposed between each adjacent two rows of the first pixel regions, each first pixel region has a plurality of first main pixels, each flexible connection region has a connection segment corresponding to one of the first main pixels, the second pixel regions are connected to the first pixel regions through one of the flexible connection regions, each second pixel region has a plurality of second main pixels, and an area of each second main pixel is equal to a sum of areas of each first main pixel and its corresponding connection segment.

3. The display panel as claimed in claim 2, wherein each first main pixel has at least one first sub-pixel, each second main pixel has at least one second sub-pixel, the at least one first sub-pixel has a first light-emitting region, the at least one second sub-pixel has a second light-emitting region, and an area of the at least one first light-emitting region equal to an area of the at least one second light-emitting region.

4. The display panel as claimed in claim 3, wherein the at least one first sub-pixel is one of red sub-pixel, green sub-pixel and blue sub-pixel, and the at least one second sub-pixel is one of red sub-pixel, green sub-pixel or blue sub-pixel.

5. The display panel as claimed in claim 4, wherein each of the first main pixels comprises one red sub-pixel, one green sub-pixel and one blue sub-pixel arranged in sequence, and each of the second main pixels comprises one red sub-pixel, one green sub-pixel, and one blue sub-pixel arranged in sequence.

6. The display panel as claimed in claim 4, wherein each of the first main pixels comprises one red sub-pixel and one green sub-pixel, or one blue sub-pixel and one green sub-pixel, or one red sub-pixel and one blue a sub-pixel, and each of the second main pixels comprises one red sub-pixel and one green sub-pixel, or one blue sub-pixel and one green sub-pixel, or one red sub-pixel and one blue sub-pixel.

7. The display panel as claimed in claim 5, wherein in each of the first pixel regions, the first main pixels each having one red sub-pixel and one green sub-pixel are alternately arranged with the first main pixels each having one blue sub-pixel and one green sub-pixel, and in each of the second pixel regions, the second main pixels each having one red sub-pixel and one green sub-pixel is alternately arranged with the second main pixels each having one blue sub-pixel and one green sub-pixel.

8. The display panel as claimed in claim 6, wherein in all of the first pixel regions, the arranged positions of the green sub-pixels correspond to each other, and in all of the second pixel regions, the arranged positions of the green sub-pixels correspond to each other.

9. The display panel as claimed in claim 1, wherein the array substrate comprises:
- a flexible substrate;
- a barrier layer overlying the flexible substrate;
- a buffer layer overlying the barrier layer;
- a first gate insulating layer overlying the buffer layer;
- a second gate insulating layer overlying the first gate insulating layer;
- a dielectric layer overlying the second gate insulating layer;
- a metal trace disposed on the dielectric layer; and
- a flat layer disposed on the dielectric layer and the metal trace;

wherein in the bending area, the slot extends from the dielectric layer to the flexible substrate, and in the position of the slot, the metal trace is disposed on the organic photoresist layer.

10. A display device, comprising the display panel as claimed in claim 1.

* * * * *